US009666564B2

(12) United States Patent
Lai et al.

(10) Patent No.: US 9,666,564 B2
(45) Date of Patent: May 30, 2017

(54) LIGHT EMITTING DEVICE

(71) Applicant: PlayNitride Inc., Tainan (TW)

(72) Inventors: Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/944,236

(22) Filed: Nov. 18, 2015

(65) Prior Publication Data

US 2016/0172341 A1     Jun. 16, 2016

Related U.S. Application Data

(60) Provisional application No. 62/092,265, filed on Dec. 16, 2014.

(30) Foreign Application Priority Data

Oct. 23, 2015  (TW) .............................. 104134825 A

(51) Int. Cl.
| | |
|---|---|
| H01L 25/07 | (2006.01) |
| H01L 25/075 | (2006.01) |
| H01L 33/62 | (2010.01) |
| H01L 33/46 | (2010.01) |

(52) U.S. Cl.
CPC .......... *H01L 25/0753* (2013.01); *H01L 33/46* (2013.01); *H01L 33/62* (2013.01); *H01L 2924/0002* (2013.01)

(58) Field of Classification Search
CPC ...... H01L 25/0753; H01L 33/60; H01L 33/62
See application file for complete search history.

(56) References Cited

U.S. PATENT DOCUMENTS

| | | | |
|---|---|---|---|
| 6,325,524 B1* | 12/2001 | Weber .................. | G03B 27/545 257/E25.02 |
| 2010/0051984 A1* | 3/2010 | West ...................... | H01L 33/44 257/98 |
| 2013/0187179 A1* | 7/2013 | Tan ......................... | H01L 33/54 257/98 |
| 2014/0159064 A1* | 6/2014 | Sakariya ............. | H01L 25/0753 257/88 |
| 2014/0367705 A1* | 12/2014 | Bibl ........................ | H01L 33/44 257/88 |

* cited by examiner

*Primary Examiner* — Matthew Reames
(74) *Attorney, Agent, or Firm* — Jianq Chyun IP Office

(57) ABSTRACT

A light emitting device includes a substrate, a plurality of micro light emitting chips, a plurality of reflective structures and a plurality of conductive bumps. The substrate has a plurality of pads. The micro light emitting chips are disposed on the substrate in dispersion, and each of the micro light emitting chips includes a light emitting layer. The reflective structures are disposed around the micro light emitting chips in dispersion, and at least cover the micro light emitting layers of the light emitting chips. The conductive bumps are disposed corresponding to the micro light emitting chips and located between the micro light emitting chips and the substrate, wherein the micro light emitting chips are electrically connected to the pads of the substrate through the conductive bumps.

5 Claims, 3 Drawing Sheets

LIGHT EMITTING DEVICE

CROSS-REFERENCE TO RELATED APPLICATION

This application claims the priority benefits of U.S. provisional application Ser. No. 62/092,265, filed on Dec. 16, 2014, and Taiwan application serial no. 104134825, filed on Oct. 23, 2015. The entirety of each of the above-mentioned patent applications is hereby incorporated by reference herein and made a part of this specification.

BACKGROUND OF THE INVENTION

Field of the Invention

The invention relates to a semiconductor device, and particularly relates to a light emitting device.

Description of Related Art

Generally, a light-emitting diode (LED) light source module includes a plurality of LED chips arranged on a substrate in a matrix. However, lateral lights emitted by two LED chips adjacent to each other are absorbed by each other, such that the lateral lights emitted by the LED chips cannot be effectively used, which decreases light emitting efficiency of the LED light source module.

SUMMARY OF THE INVENTION

The invention is directed to a light emitting device, which has better light emitting efficiency and light emitting uniformity.

The invention provides a light emitting device including a substrate, a plurality of micro light emitting chips, a plurality of reflective structures and a plurality of conductive bumps. The substrate has a plurality of pads. The micro light emitting chips are disposed on the substrate in dispersion, and each of the micro light emitting chips includes a light emitting layer. The reflective structures are disposed around the micro light emitting chips in dispersion, and at least cover the light emitting layers of the micro light emitting chips. The conductive bumps are disposed corresponding to the micro light emitting chips and located between the micro light emitting chips and the substrate, where the micro light emitting chips are electrically connected to the pads of the substrate through the conductive bumps.

In an embodiment of the invention, each of the reflective structures includes a first reflective structure directly covering a side surface of at least one of the micro light emitting chips, and the first reflective structures are not connected to each other.

In an embodiment of the invention, a thickness of each of the first reflective structures located adjacent to one side of the substrate is smaller than a thickness of each of the first reflective structures located away from the side of the substrate.

In an embodiment of the invention, each of the reflective structures further includes a second reflective structure covering a lower surface of each of the micro light emitting chips and exposing a part of the lower surface, and the conductive bumps respectively and directly contact the lower surfaces exposed by the second reflective structures.

In an embodiment of the invention, each of the first reflective structures is an insulation reflective layer, and each of the second reflective structures is a conductive reflective layer.

In an embodiment of the invention, each of the micro light emitting chips further includes a first type semiconductor layer, a second type semiconductor layer and a bonding pad. The light emitting layer is located between the first type semiconductor layer and the second type semiconductor layer, and the bonding pad is located between the first type semiconductor layer and the substrate and is electrically connected to one of the conductive bumps.

In an embodiment of the invention, the reflective structures include a plurality of first reflective structures located on the substrate in dispersion. A height of each of the first reflective structures is greater than a distance between the light emitting layer of each of the micro light emitting chips and the substrate.

In an embodiment of the invention, the reflective structures further include a plurality of second reflective structures, each of the micro light emitting chips has a lower surface, and the second reflective structures are located between the lower surfaces of the micro light emitting chips and the conductive bumps.

In an embodiment of the invention, the reflective structures further include a plurality of third reflective structures, each of the micro light emitting chips has an upper surface opposite to the lower surface, and the third reflective structures are located on the upper surfaces of the micro light emitting chips.

In an embodiment of the invention, a height of each of the first reflective structures is greater than a distance between the light emitting layer of each of the micro light emitting chips and the substrate, and the height of each of the first reflective structures is smaller than a distance between the upper surface of each of the micro light emitting chips and the substrate.

In an embodiment of the invention, a maximum peak current density of an external quantum efficiency curve of each of the micro light emitting chips is between 0.01 A/cm$^2$ and 2 A/cm$^2$.

In an embodiment of the invention, a defect density of each of the micro light emitting chips is between 10$^4$/cm$^2$ and 10$^8$/cm$^2$.

According to the above descriptions, since the light emitting device of the invention has the reflective structures, where the reflective structures are disposed around the micro light emitting chips, and at least cover the light emitting layers of the micro light emitting chips, a forward light flux of the light emitting device is enhanced and a lateral light flux thereof is decreased. Moreover, by using the reflective structures, the lights emitted by the light emitting layers of the micro light emitting chips may have a uniform light emitting effect through reflection. In this way, the light emitting device of the invention may achieve better light emitting efficiency and light emitting uniformity.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
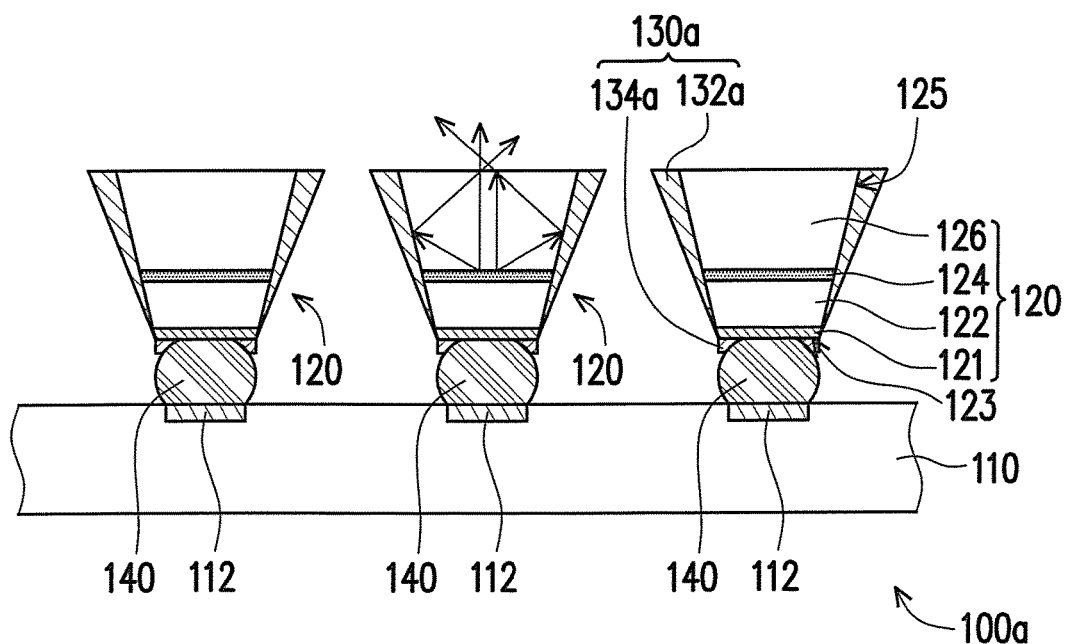
FIG. 1A is a cross-sectional view of a light emitting device according to an embodiment of the invention.

FIG. 1A is a cross-sectional view of a light emitting device according to an embodiment of the invention. Referring to FIG. 1A, the light emitting device 100a include a substrate 110, a plurality of micro light emitting chips 120, a plurality of reflective structures 130a and a plurality of conductive bumps 140. The substrate 110 has a plurality of pads 112. The micro light emitting chips 120 are disposed on the substrate 110 in dispersion, and each of the micro light emitting chips 120 includes a light emitting layer 124. The reflective structures 130a are disposed around the micro light emitting chips 120 in dispersion, and at least cover the light emitting layers 124 of the micro light emitting chips 120. The conductive bumps 140 are disposed corresponding to the micro light emitting chips 120 and located between the micro light emitting chips 120 and the substrate 110, where the micro light emitting chips 120 are electrically connected to the pads 112 of the substrate 110 through the conductive bumps 140.

Figure 1B:
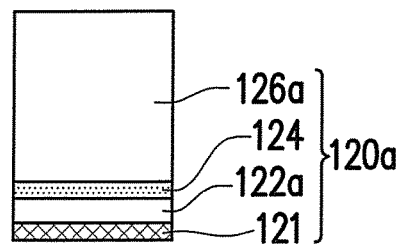
FIG. 1B to FIG. 1C are cross-sectional views of a light emitting chip according to two embodiments of the invention.
Figure 1C:
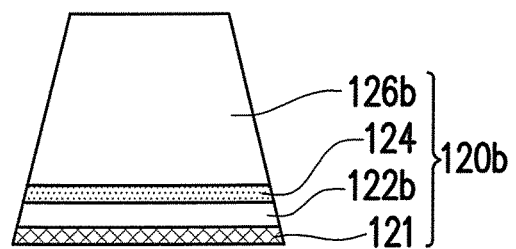

In detail, the substrate 110 of the present embodiment is embodied as a driving substrate, which is, for example, a circuit substrate, a display substrate, a lighting substrate, a substrate having transistors or integrated circuits (Ics) or a substrate having meal redistribution lines, which is not limited by the invention. As shown in FIG. 1A, the pads 112 are embedded in the substrate 110, though in other embodiment that is not illustrated, the pads can also be disposed on a surface of the substrate, which is still within a protection range of the invention. Each of the micro light emitting chips 120 further includes a first type semiconductor layer 122, a second type semiconductor layer 126 and a bonding pad 121. The light emitting layer 124 is located between the first type semiconductor layer 122 and the second type semiconductor layer 126, and the bonding pad 121 is located between the first type semiconductor layer 122 and the substrate 110 and is electrically connected to the conductive bump 140. As shown in FIG. 1A, a profile of the micro light emitting chip 120 is embodied as an inverted trapezoid, where an area of the second type semiconductor layer 126 is greater than an area of the first type semiconductor layer 122, though the invention is not limited thereto. In another embodiment, referring to FIG. 1B, the profile of the micro light emitting chip 120a is embodied as a rectangle, where the area of the second type semiconductor layer 126a of the micro light emitting chip 120a is slightly greater than the area of the first type semiconductor layer 122a; or referring to FIG. 1C, the profile of the micro light emitting chip 120b is embodied as a trapezoid, where the area of the second type semiconductor layer 126b of the micro light emitting chip 120b is smaller than the area of the first type semiconductor layer 122b. In the micro light emitting chip 120 of the present embodiment, the first type semiconductor layer 122 is, for example, a P-type semiconductor layer, the second type semiconductor layer 126 is, for example, an N-type semiconductor layer, and the light emitting layer 124 is a multiple quantum well (MQW) structure. In other embodiment that is not illustrated, the first type semiconductor layer 122 can be an N-type semiconductor layer, the second type semiconductor layer 126 can be a P-type semiconductor layer, and the light emitting layer 124 is a MQW structure.

As shown in FIG. 1A, a thickness of the second type semiconductor layer 126 of the present embodiment is greater than a thickness of the first type semiconductor layer 122, where the thickness of the second type semiconductor layer 126 is, for example, 3 µm, and the thickness of the first type semiconductor layer 122 is, for example, 0.5 µm. Therefore, the light emitting layers 124 are closer to the conductive bumps 140 and the pads 112 of the substrate 110, such that the heat generated by the micro light emitting chips 120 can be effectively transmitted to external through the conductive bumps 140 and the substrate 110, so as to achieve a better heat dissipation effect of the light emitting device 100a. Moreover, a maximum peak current density of an external quantum efficiency curve of each of the micro light emitting chips 120 of the present embodiment is preferably between 0.01 A/cm$^2$ and 2 A/cm$^2$. Namely, the micro light emitting chips 120 of the present embodiment are adapted to operate under a low current density. Moreover, each of the micro light emitting chips 120 of the present embodiment may serve as a sub-pixel in a display, and the micro light emitting chip 120 of the present embodiment has a different dimension specification with that of the commonly-used light emitting diode (LED) chip. In detail, a side length dimension of the commonly used LED chip is 0.2 mm to 1 mm, and a side length dimension of each of the micro light emitting chips 120 of the present embodiment is 1 µm to 100 µm, preferably, the side length dimension of each of the micro light emitting chips 120 is 3 µm to 40 µm. Moreover, a defect density of each of the micro light emitting chips 120 of the present embodiment is relatively lower, and preferably the defect density of each of the micro light emitting chips 120 is between 10$^4$/cm$^2$ and 10$^8$/cm$^2$. Moreover, the micro light emitting chips 120 of the present embodiment can be light emitting chips of a same color, or include at least one red light emitting chip, at least one green light emitting chip and at least one blue light emitting chip, which is not limited by the invention.

Moreover, each of the reflective structures 130a of the present embodiment includes a first reflective structure 132a, where the first reflective structure 132a directly covers a side surface 125 of each of the micro light emitting chips 120, and the first reflective structures 132a are not connected to each other. As shown in FIG. 1A, the side surface 125 of each of the micro light emitting chips 120 is directly covered by the first reflective structure 132a. In other words, the first reflective structures 132a directly cover the light emitting layers 124 of the micro light emitting chips 120, where the first reflective structures 132a are, for example, insulation reflective layers, which not only effectively protect the light emitting layers 124 of the micro light emitting chips 120, but also have an effect of preventing current leakage. Moreover, the thickness of the first reflective structures 132a of the reflective structures 130a is not consistent, i.e. the thickness of each of the first reflective structures 132a located adjacent to one side of the substrate 110 is smaller than a thickness of each of the first reflective structures 132a located away from the side of the substrate 110. In other words, the farther the first reflective structure 132a is away from the substrate 110, the thicker the thickness thereof is, which avoids an optical crosstalk phenomenon between the micro light emitting chips 120, such that when each of the micro light emitting chips 120 serves as a sub-pixel of a display, the display quality of the display is better.

Moreover, each of the reflective structures 130a further includes a second reflective structure 134a, where the second reflective structure 134a covers a lower surface 123 of each of the micro light emitting chips 120 and exposes a part of the lower surface 123, and the conductive bumps 140 respectively and directly contact the lower surfaces 123 exposed by the second reflective structures 134a. Each of the second reflective structures 134a is, for example, a conductive reflective layer, which not only has a reflection function, but also is capable of electrically connecting the conductive bump 140.

Since the light emitting device 100a of the present embodiment has the reflective structures 130a, where the first reflective structure 132a of each of the reflective structures 130a directly covers the side surface 125 of each of the micro light emitting chips 120, and the second reflective structure 134a of each of the reflective structures 130a covers the lower surface 123 of each of the micro light emitting chips 120 and exposes a part of the lower surface 123, namely, the side surface 125 and the lower surface 123 of the micro light emitting chip 120 are all configured with the reflective structure 130a, the forward light flux of the light emitting device 100a can be enhanced through the configuration of the first reflective structures 132a, and the lateral light flux can be decreased. Moreover, regarding the light emitting uniformity of the light emitting device 100a, by configuring the second reflective structures 134a, reflection of the lights emitted by the light emitting layers 124 of the micro light emitting chips 120 is enhanced, so as to improve the whole light emitting uniformity of the light emitting device 100a. In brief, the light emitting device 100a of the present embodiment may have better light emitting efficiency and light emitting uniformity.

It should be noted that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 2:
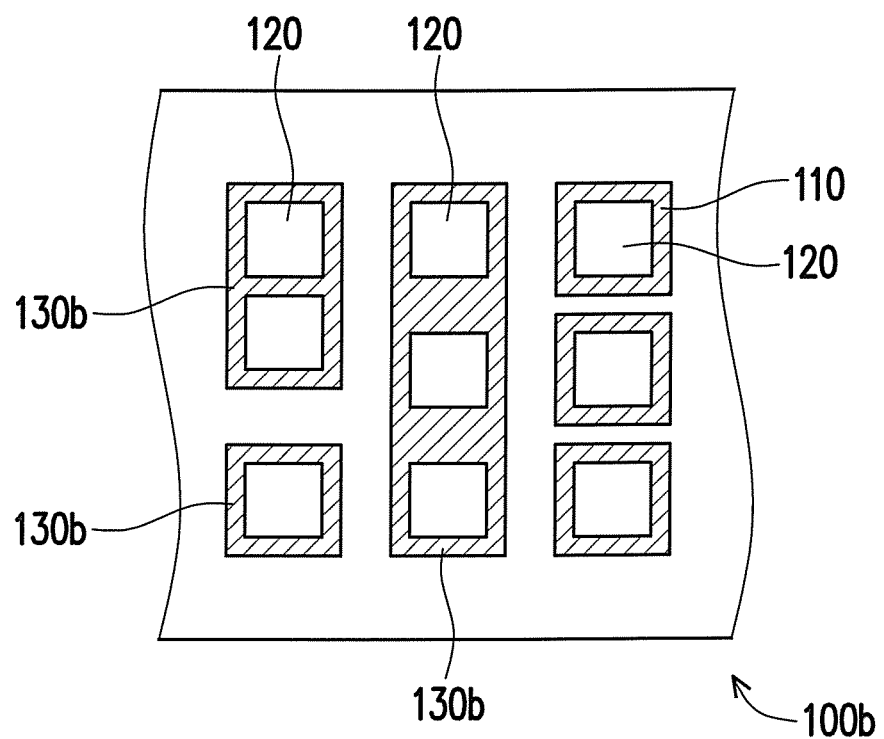
FIG. 2 is a partial top view of a light emitting device according to another embodiment of the invention.

FIG. 2 is a partial top view of a light emitting device according to another embodiment of the invention. Referring to FIG. 1A and FIG. 2, the light emitting device 100b of the present embodiment is similar to the light emitting device 100a of FIG. 1A, and a main difference there between is that each of the reflective structures 130a of the light emitting device 100a of FIG. 1A corresponds to one micro light emitting chip 120, though the each of the reflective structures 130b in the light emitting device 100b of FIG. 2 may correspond to more than one micro light emitting chip 120, where the micro light emitting chips 120 can be light emitting chips of the same color or different colors, which is not limited by the invention.

Figure 3:
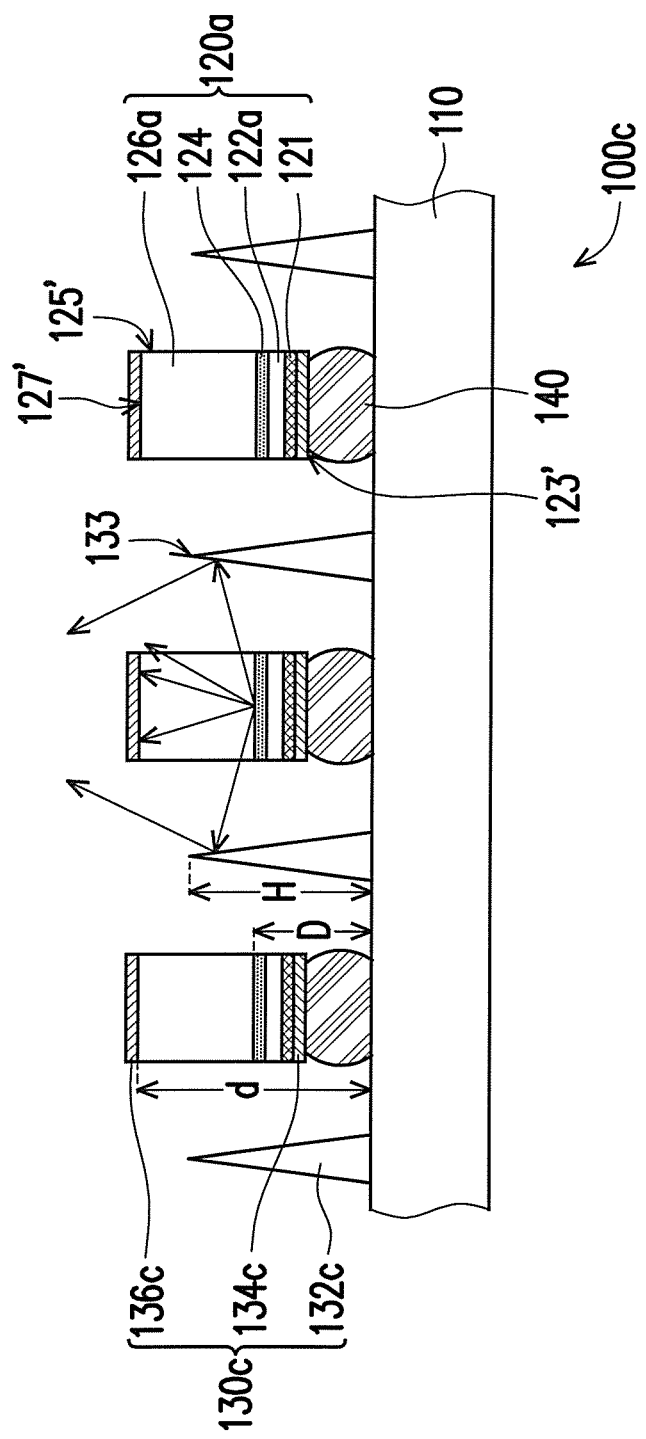
FIG. 3 is a cross-sectional view of a light emitting device according to another embodiment of the invention.

FIG. 3 is a cross-sectional view of a light emitting device according to another embodiment of the invention. Referring to FIG. 1A and FIG. 3, the light emitting device 100c of the present embodiment is similar to the light emitting device 100a of FIG. 1A, and a main difference there between is that a structure pattern of the micro light emitting chips 120a and configuration positions of the reflective structures 130c of the light emitting device 100c of the present embodiment are all different to the structure pattern of the micro light emitting chips 120 and the configuration positions of the reflective structures 130c of the light emitting device 100a of FIG. 1A.

In detail, in the micro light emitting chip 120 of FIG. 1A, an edge of the first type semiconductor layer 122, an edge of the light emitting layer 124, an edge of the second type semiconductor layer 126 and an edge of the bonding pad 121 are not aligned. However, in the micro light emitting chip 120a of the present embodiment, the edge of the first type semiconductor layer 122a, the edge of the light emitting layer 124, the edge of the second type semiconductor layer 126a and the edge of the bonding pad 121 are all aligned. A main reason causing the aforementioned structural difference is a manufacturing process variation, which does not influence essential functions of the micro light emitting chips 120, 120a. In brief, a profile of the micro light emitting chip 120a of the present embodiment can be embodied as a rectangle, where an area of the second type semiconductor layer 126a of the micro light emitting chip 120a is slightly greater than an area of the first type semiconductor layer 122a.

The reflective structures 130c of the present embodiment includes a plurality of first reflective structures 132c, where the first reflective structures 132c are disposed on the substrate 110 in dispersion, and a height H of each of the first reflective structures 132c is greater than a distance D between the light emitting layer 124 of each of the micro light emitting chips 120a and the substrate 110. In other words, the first reflective structures 132c do not direct contact the micro light emitting chips 120a, but are disposed around the micro light emitting chips 120a. Moreover, the reflective structures 130c of the present embodiment further include a plurality of second reflective structures 134c, where each of the micro light emitting chips 120a has a lower surface 123', and the second reflective structures 134c are located between the lower surfaces 123' of the micro light emitting chips 120a and the conductive bumps 140. Namely, the second reflective structures 134c are disposed on the lower surfaces 123' of the micro light emitting chips 120a. Moreover, the reflective structures 130c of the present embodiment may further include a plurality of third reflective structures 136c, where each of the micro light emitting chips 120a has an upper surface 127' opposite to the lower surface 123', and the third reflective structures 136c are disposed on the upper surfaces 127' of the micro light emitting chips 120a, and the height H of each of the first reflective structures 132c is greater than the distance D between the light emitting layer 124 of each of the micro light emitting chips 120a and the substrate 110, and the height H of each of the first reflective structures 132c is smaller than a distance d between the upper surface 127' of each of the micro light emitting chips 120a and the substrate 110. A light reflectance of the reflective structures 130c is higher than 95%, and a material thereof is, for example, Ag, Ni, Al, Rh, Pd, Ir, Ru, Zn, Pt, Au, Hf and an alloy thereof, and at least one of the above materials is adopted to form a single layer structure or a multi-layer structure.

Since the height H of each of the first reflective structures 132c of the light emitting device 100c is greater than the distance D between the light emitting layer 124 of each of the micro light emitting chips 120a and the substrate 110, the light emitted by the light emitting layers 124 of the micro light emitting chips 120a can be reflected by the first reflective structures 132c to emit forward. In this way, the forward light flux of the light emitting device 100c can be effectively enhanced, such that the light emitting device 100c has better light emitting efficiency. Moreover, configuration of the second reflective structures 134c and the third reflective structures 136c may effectively enhance a reflection effect of the lights emitted by the light emitting layers 124 of the micro light emitting chips 120a, such that the light emitting device 100c of the present embodiment may have better light emitting uniformity. In brief, the light emitting device 100c of the present embodiment has better light emitting efficiency and light emitting uniformity.

In summary, since the light emitting device of the invention has the reflective structures, where the reflective structures are disposed around the micro light emitting chips, and at least shield the light emitting layers of the micro light emitting chips, a forward light flux of the light emitting device is enhanced and a lateral light flux thereof is decreased. Moreover, by using the reflective structures, the lights emitted by the light emitting layers of the micro light emitting chips may have a uniform light emitting effect through reflection. In this way, the light emitting device of the invention may achieve better light emitting efficiency and light emitting uniformity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting device, comprising:
a substrate, having a plurality of pads;
a plurality of micro light emitting chips, disposed on the substrate separately and each of the micro light emitting chips comprising a light emitting layer;
a plurality of reflective structures, physically separated from each other and each of the reflective structures disposed around each of the micro light emitting chips, the reflective structures being spaced apart from the substrate, wherein each of the reflective structures comprises a first reflective structure directly covering a side surface of at least one of the micro light emitting chips; and
a plurality of conductive bumps, disposed corresponding to the micro light emitting chips and located between the micro light emitting chips and the substrate, wherein the micro light emitting chips are electrically bonded to the pads of the substrate through the conductive bumps.

2. The light emitting device as claimed in claim 1, wherein a thickness of each of the first reflective structures located adjacent to one side of the substrate is smaller than a thickness of each of the first reflective structures located away from the side of the substrate.

3. The light emitting device as claimed in claim 1, wherein each of the reflective structures further comprises a second reflective structure covering a lower surface of each of the micro light emitting chips and exposing a part of the lower surface, and the conductive bumps respectively and directly contact the lower surfaces exposed by the second reflective structures.

4. The light emitting device as claimed in claim 3, wherein each of the first reflective structures is an insulation reflective layer, and each of the second reflective structures is a conductive reflective layer.

5. The light emitting device as claimed in claim 1, wherein each of the micro light emitting chips further comprises a first type semiconductor layer, a second type semiconductor layer and a bonding pad, the light emitting layer is located between the first type semiconductor layer and the second type semiconductor layer, and the bonding pad is located between the first type semiconductor layer and the substrate and is electrically connected to one of the conductive bumps.

* * * * *